United States Patent
Wu et al.

(10) Patent No.: US 8,319,206 B2
(45) Date of Patent: Nov. 27, 2012

(54) THIN FILM TRANSISTORS COMPRISING SURFACE MODIFIED CARBON NANOTUBES

(75) Inventors: Yiliang Wu, Mississauga (CA); Yuning Li, Mississauga (CA); Ping Liu, Mississauga (CA); Paul F. Smith, Oakville (CA); Hadi K. Mahabadi, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 878 days.

(21) Appl. No.: 11/946,953

(22) Filed: Nov. 29, 2007

(65) Prior Publication Data

US 2009/0140236 A1    Jun. 4, 2009

(51) Int. Cl.
*H01L 51/30*    (2006.01)

(52) U.S. Cl. .................. 257/40; 257/E51.008

(58) Field of Classification Search .................... 257/40, 257/E51.008; 977/745
See application file for complete search history.

(56) References Cited

U.S. PATENT DOCUMENTS

| | | | |
|---|---|---|---|
| 2003/0077515 A1 | 4/2003 | Chen et al. | |
| 2004/0223900 A1* | 11/2004 | Khabashesku et al. | 423/447.1 |
| 2004/0241900 A1 | 12/2004 | Tsukamoto et al. | |
| 2004/0265755 A1* | 12/2004 | Park et al. | 430/322 |
| 2005/0221530 A1 | 10/2005 | Cheng et al. | |
| 2006/0240605 A1* | 10/2006 | Moon et al. | 438/149 |
| 2008/0191198 A1* | 8/2008 | Han et al. | 257/40 |

* cited by examiner

*Primary Examiner* — Thomas L Dickey
(74) *Attorney, Agent, or Firm* — Fay Sharpe LLP

(57) ABSTRACT

A thin film transistor has a semiconducting layer comprising a semiconductor and surface-modified carbon nanotubes. The semiconducting layer has improved charge carrier mobility.

15 Claims, 3 Drawing Sheets

THIN FILM TRANSISTORS COMPRISING SURFACE MODIFIED CARBON NANOTUBES

BACKGROUND

The present disclosure relates, in various embodiments, to thin-film transistors (TFTs) comprising a semiconducting layer having surface modified carbon nanotubes (SMCNTs) included therein. Methods for making and using the same are also disclosed.

There is interest in organic thin film transistors (OTFTs) for applications such as radio frequency identification (RFID) tags and backplane switching circuits for displays, such as liquid crystal displays, where high switching speeds and/or high density are not essential. OTFTs may be made using low-cost solution or liquid fabrication techniques. They also have attractive mechanical properties such as being physically compact, lightweight, and flexible.

OTFTs are generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes. Their performance can be determined by the field effect mobility and the current on/off ratio. High mobility and high on/off ratio are desired.

BRIEF DESCRIPTION

The present application discloses, in various exemplary embodiments, thin film transistors. A small amount of surface modified carbon nanotubes (SMCNTs) are incorporated into the semiconducting layer of such TFTs.

In embodiments, an organic thin-film transistor comprises a substrate, a dielectric layer, and a semiconducting layer, wherein the semiconducting layer comprises an organic semiconductor and surface-modified carbon nanotubes (SMCNTs). The SMCNTs may be dispersed, such as being substantially dispersed, throughout the organic semiconductor.

The SMCNTs may be present in the amount of from about 0.001 to about 10 weight percent, based on the weight of the organic semiconductor. The SMCNTs may also be present in the amount of from about 0.01 to about 5 weight percent, based on the total weight of the organic semiconductor.

The semiconducting layer may comprise a first layer and a second layer. The SMCNTs may be present in the first layer and an organic semiconductor may be present in the second layer. In such an embodiment, the first layer is located closer to the dielectric layer than the second layer.

The SMCNTs may be present in greater than 10% by volume of the total volume of the semiconducting layer.

The SMCNTs may be modified with a conjugated group. For example, the SMCNTs may be modified with a conjugated group selected from the group consisting of thiophene-based oligomers and polymers, pyrenes, phthalocyanines, polyphenylvinylidenes, polyfluorenes, polycarbazoles, polytriarylamines, and polyphenylenes.

Additionally, the SMCNTs may be modified with thiophene-based oligomers or polymers of Formula A or B:

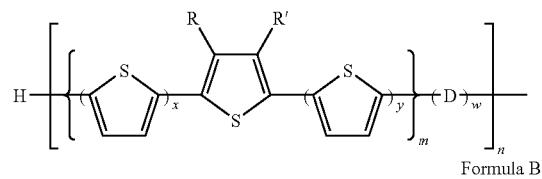

Formula A

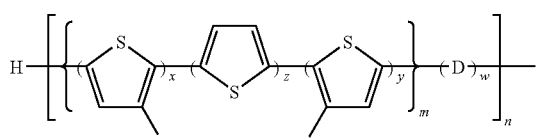

Formula B wherein x, y, and z may be independently integers from 0 to 7; m is an integer from 1 to 3; n is an integer from 1 to 50; w is an integer from 0 to 5; R and R' may be independently selected from hydrogen, halogen, alkyl, alkoxyalkyl, siloxyalkyl, and perfluoroalkyl; and D is a divalent linkage.

The SMCNTs may also be modified with a non-conjugated group. For example, the SMCNTs may be modified with a non-conjugated group selected from the group consisting of polymers or oligomers of polyurethane, polystyrene, polyvinyl alcohol, polyacrylate, polyimide, polyester, polyamide, and polysiloxane; hydrocarbon groups containing 1 to 30 carbon atoms; and heteroatom-containing groups including halogen, alkoxy, alkoxyalkyl, cyano, and nitro.

Moreover, the SMCNTs may be modified with a group comprising an acidic moiety, the acidic moiety being selected from the group consisting of carboxylic acid, sulfonic acid, phosphinic acid, sulfuric acid, nitric acid, and phosphoric acid.

Furthermore, the SMCNTs may be single-wall carbon nanotubes, double-wall carbon nanotubes, or multi-wall carbon nanotubes.

The semiconducting layer may further comprise non-surface-modified carbon nanotubes (non-SMCNTs). The non-SMCNTs may be present in the amount of from about 0.001 to about 10 weight percent, based on the weight of the organic semiconductor. For example, the non-SMCNTs may be present in the amount of from about 0.01 to about 5 weight percent, based on the weight of the organic semiconductor.

The transistor may have a charge carrier mobility of greater than 0.01 cm$^2$/V·sec.

The transistor may have a mobility that is at least 10% greater than a transistor without SMCNTs in the organic semiconducting layer.

The SMCNTs may be modified with an inorganic material. The inorganic material may be a conducting or semiconducting material selected from the group consisting of gold, silver, copper, nickel, zinc, cadmium, palladium, platinum, chromium, aluminum, ZnO, ZnSe, CdSe, $Zn_aIn_bO_c$ (where a, b, and c are integers), GaAs, $ZnO.SnO_2$, $SnO_2$, gallium, germanium, tin, indium, indium oxide, and indium tin oxide. The inorganic material may also be nanoparticles selected from the group consisting of gold, silver, nickel, copper, ZnO, CdSe, $Zn_aIn_bO_c$, GaAs, $ZnO.SnO_2$, $SnO_2$, and ZnSe nanoparticles.

The SMCNTs may be further modified with a conjugated group via non-covalent attachment. The SMCNTs may also be modified with a covalently bonded group.

In other embodiments, a semiconducting layer comprises an organic semiconductor and SMCNTs, wherein the SMCNTs are modified with an thiophene-based oligomers and polymers of Formula A or B:

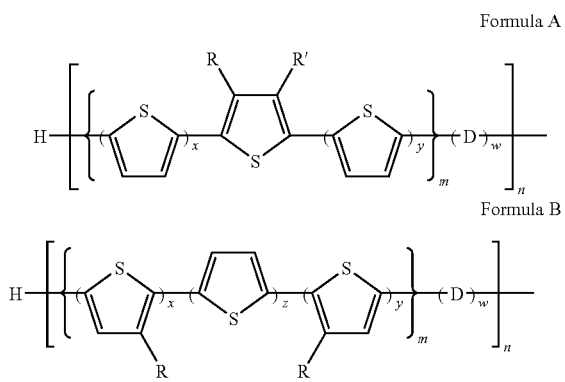

Formula A

Formula B wherein x, y, and z are independently integers from 0 to 7; m is an integer from 1 to 3; n is an integer from 1 to 50; w is an integer from 0 to 5; R and R' are independently selected from hydrogen, halogen, alkyl, alkoxyalkyl, siloxyalkyl, and perfluoroalkyl; and D is a divalent linkage.

In still other embodiments, a thin-film transistor comprises a substrate, a dielectric layer, and a semiconducting layer, wherein the semiconducting layer comprises an inorganic semiconductor and surface-modified carbon nanotubes (SM-CNTs).

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
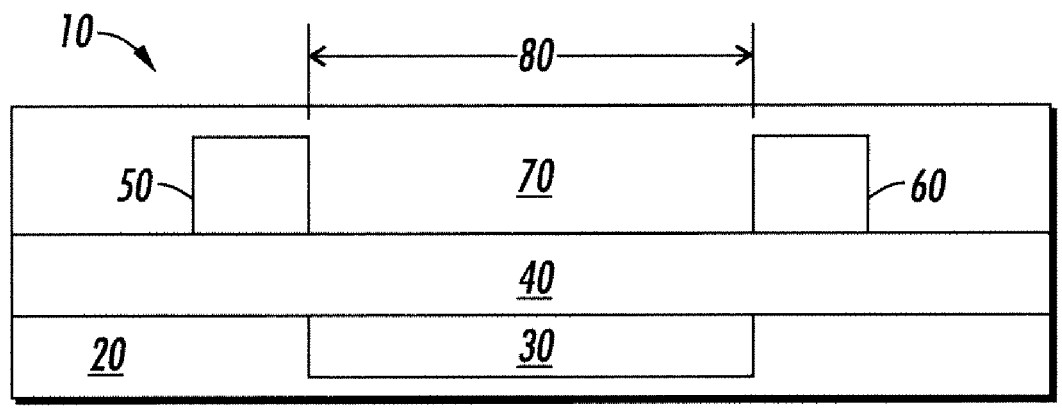
FIG. 1 represents a first embodiment of a TFT according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

FIG. 1 illustrates a bottom-gate bottom-contact TFT configuration according to the present disclosure. The TFT 10 comprises a substrate 20 in contact with the gate electrode 30 and a gate dielectric layer 40. Although here the gate electrode 30 is depicted within the substrate 20, this is not required. However, it is important that the gate dielectric layer 40 separates the gate electrode 30 from the source electrode 50, drain electrode 60, and the semiconducting layer 70. The semiconducting layer 70 runs over and between the source and drain electrodes 50 and 60. The semiconductor has a channel length 80 between the source and drain electrodes 50 and 60.

Figure 2:
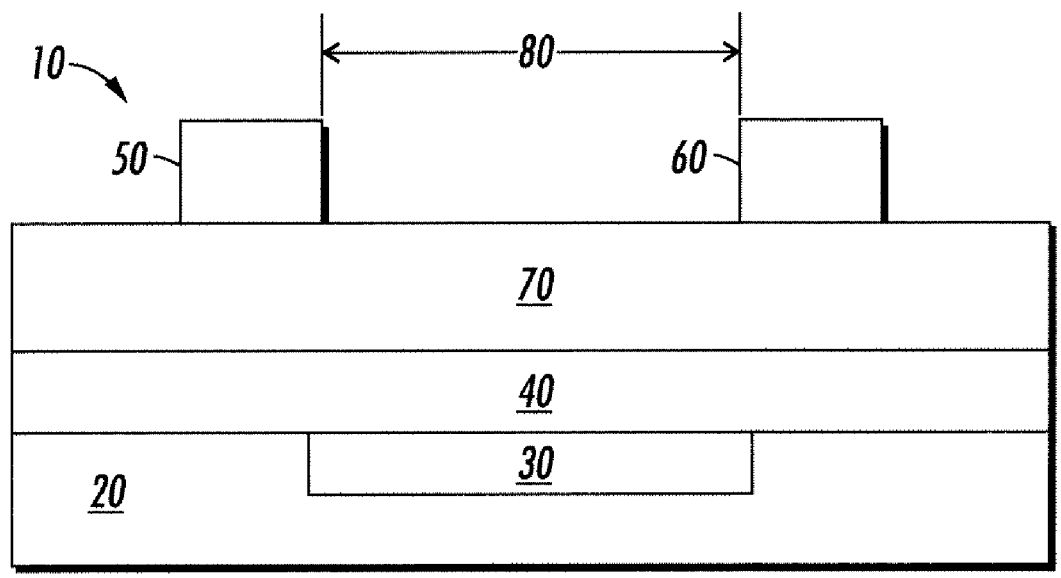
FIG. 2 represents a second embodiment of a TFT according to the present disclosure.

FIG. 2 illustrates another bottom-gate top-contact TFT configuration according to the present disclosure. The TFT 10 comprises a substrate 20 in contact with the gate electrode 30 and a gate dielectric layer 40. The semiconducting layer 70 is placed on top of the gate dielectric layer 40 and separates it from the source and drain electrodes 50 and 60.

Figure 3:
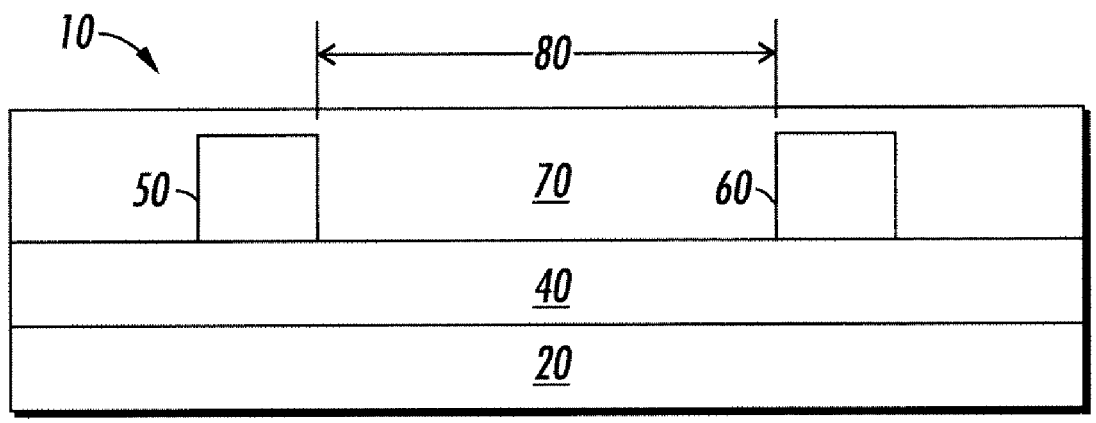
FIG. 3 represents a third embodiment of a TFT according to the present disclosure.

FIG. 3 illustrates a bottom-gate bottom-contact TFT configuration according to the present disclosure. The TFT 10 comprises a substrate 20 which also acts as the gate electrode and is in contact with a gate dielectric layer 40. The source electrode 50, drain electrode 60, and semiconducting layer 70 are located atop the gate dielectric layer 50.

Figure 4:
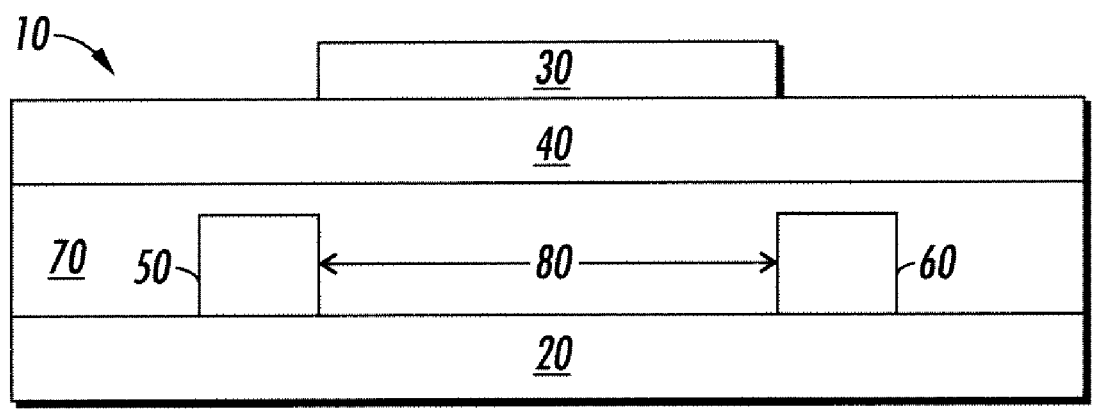
FIG. 4 represents a fourth embodiment of a TFT according to the present disclosure.

FIG. 4 illustrates a top-gate top-contact TFT configuration according to the present disclosure. The TFT 10 comprises a substrate 20 in contact with the source electrode 50, drain electrode 60, and the semiconducting layer 70. The semiconducting layer 70 runs over and between the source and drain electrodes 50 and 60. The gate dielectric layer 40 is on top of the semiconducting layer 70. The gate electrode 30 is on top of the gate dielectric layer 40 and does not contact the semiconducting layer 70.

Figure 5:
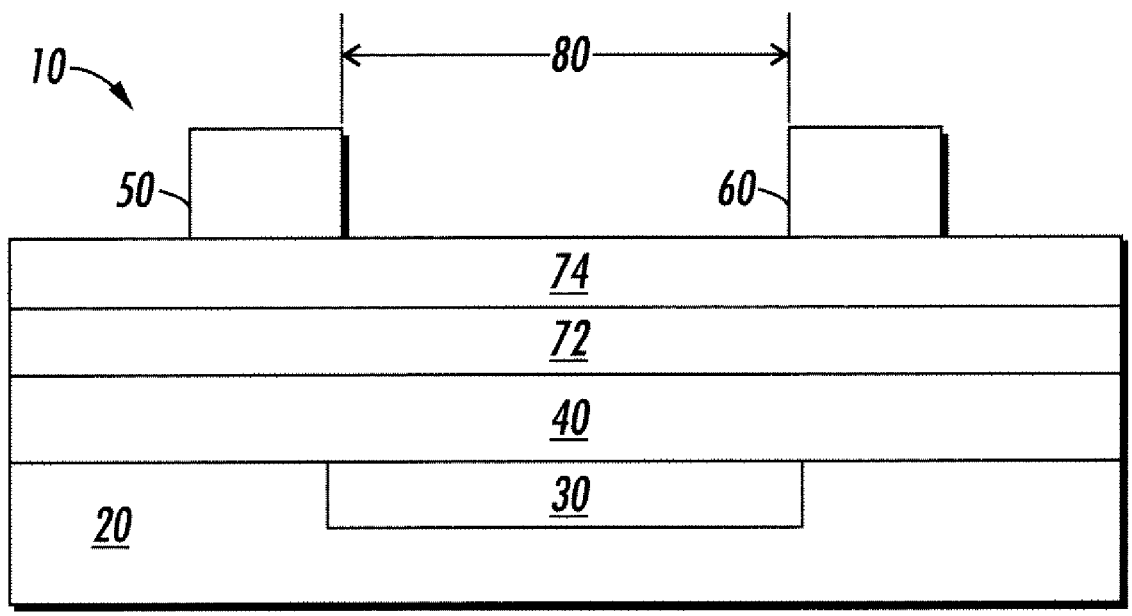
FIG. 5 represents a fifth embodiment of a TFT according to the present disclosure.

FIG. 5 illustrates a bottom-gate top-contact TFT configuration similar to that of FIG. 2. However, the semiconducting layer 70 comprises a first layer 72 and a second layer 74. The first layer contains a majority of surface-modified carbon nanotubes and the second layer contains a majority of semiconductor.

The semiconducting layer of the present disclosure may comprise an organic semiconductor. Regarding electrical performance characteristics, the organic semiconductor usually has a conductivity in the range of $10^{-8}$ to $10^{-4}$ S/cm, preferably in the range of $10^{-7}$ to $10^{-5}$ S/cm. Various dopants known in the art may also be added to change the conductivity. The organic semiconductor can be either a p-type or n-type semiconductor. Examples of organic semiconductors include but are not limited to acenes, such as anthracene, tetracene, pentacene, and substituted pentacenes, perylenes, fullerenes, oligothiophenes, polythiophenes and their substituted derivatives, polypyrrole, poly-p-phenylenes, poly-p-phenylvinylidenes, naphthalenedicarboxylic dianhydrides, naphthalene-bisimides, polynaphthalenes, phthalocyanines such as copper phthalocyanines, titanyl phthalocyanines, or zinc phthalocyanines and their substituted derivatives.

In specific embodiments, the organic semiconductors are polythiophenes. Polythiophenes include, for example, regioregular and regiorandom poly(3-alkylthiophene)s, polythiophenes comprising substituted and unsubstituted thienylene groups, polythiophenes comprising optionally substituted thieno[3,2-b]thiophene and/or optionally substituted thieno[2,3-b]thiophene groups, polythiophenes comprising fused-ring aromatic groups such as benzothiophene, benzodithiophene, and indolocarbazole, polythiophenes comprising heteroatom-containing fused-ring aromatic groups, and polythiophenes comprising non-thiophene based aromatic groups such as phenylene, fluorene, furan, and the like.

In other embodiments, the semiconducting layer comprises an inorganic semiconductor such as ZnO, ZnSe, CdSe, $Zn_aIn_bO_c$, GaAs, $ZnO.SnO_2$, $SnO_2$, and the like.

The semiconducting layer further comprises surface-modified carbon nanotubes (SMCNTs). The surfaces of the carbon nanotubes (CNTs) can be modified in two ways: non-covalent attachment and covalent attachment. Non-covalent attachment is based mainly on van der Waals forces. For example, pyrene can be non-covalently attached to a carbon nanotube surface through pi-pi stacking interactions or through polymer wrapping.

The surfaces of the carbon nanotubes may be modified with a conjugated group, a non-conjugated group, a small molecular group, an inorganic material, and combinations thereof.

In specific embodiments, the conjugated group is selected from the group consisting of thiophene-based oligomers and polymers, pyrenes, phthalocyanines, polyphenylvinylidenes, polyfluorenes, polycarbazoles, polytriarylamines, and polyphenylenes. The conjugated group can be covalently bonded directly to the surface of the carbon nanotubes or through a linking group, such as amide or ester.

In other specific embodiments, the non-conjugated group is selected from the group consisting of polymers and/or oligomers of polyurethane, polystyrene, polyvinyl alcohol, polyacrylate, polyimide, polyester, polyamide, and polysiloxane. The non-conjugated group may also be a small molecular group. Exemplary small molecular groups include hydrocarbon groups containing 1 to 30 carbon atoms, such as alkyl, and heteroatom-containing groups such as halogen, alkoxy, alkoxyalkyl, cyano, or nitro. In further specific embodiments, the polymer is selected from the group consisting of polystyrene, poly(methyl methacrylate), poly(vinyl alcohol), poly(vinyl phenol), poly(vinyl carbazole), poly(vinyl cinamate), poly(a-methyl styrene). In further specific embodiments, the small molecular group is selected a group comprising an acidic moiety, selected from the group consisting of carboxylic acid, sulfonic acid, phosphinic acid, sulfuric acid, nitric acid, phosphoric acid, and the like. In specific embodiments, the SMCNTs are modified with carboxylic acid, sulfuric acid, and nitric acid. The carbon nanotube-supported acid can dope a semiconductor, particularly p-type semiconductor, to enhance conductivity of the semiconductor layer and thus the field-effect mobility of the transistors.

In specific embodiments, the inorganic material may be conducting or semiconducting. Exemplary inorganic materials include metals and metal oxides such as gold, silver, copper, nickel, zinc, cadmium, palladium, platinum, chromium, aluminum, ZnO, ZnSe, CdSe, $Zn_aIn_bO_c$(where a, b, and c are integers), GaAs, $ZnO.SnO_2$, $SnO_2$, gallium, germanium, tin, indium, indium oxide, indium tin oxide, and the like. The inorganic material may homogenously cover the surface of the carbon nanotubes or be in nanoparticle form on the surface of the carbon nanotubes. In specific embodiment, the SMCNTs are modified with nanoparticles selected from the group consisting of gold, silver, nickel, copper, ZnO, CdSe, $Zn_aIn_bO_c$, GaAs, $ZnO.SnO_2$, $SnO_2$, and ZnSe nanoparticles.

In embodiments, the SMCNT may be represented by the following formula:

CNT-$R_1$-$R_2$ wherein CNT represents the carbon nanotube, $R_1$ is a inking group selected from ester (—COO—) and amide (—CONH—); and $R_2$ is a conjugated group, a non-conjugated group, a small molecular group, an inorganic material, and combinations thereof. The degree of surface modification may vary from about one group per carbon nanotube to about one thousand groups per carbon nanotube.

In some specific embodiments, the surfaces of the carbon nanotubes are modified with thiophene-based oligomers and/or polymers of Formula A or B:

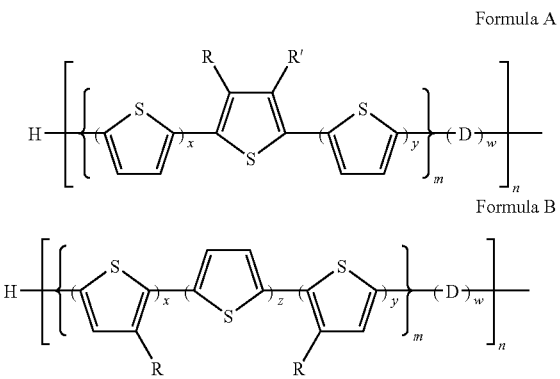

Formula A

Formula B wherein x, y, and z are independently integers from 0 to 7; m is an integer from 1 to 3; n is an integer from 1 to 50; w is an integer from 0 to 5; R and R' are independently selected from hydrogen, halogen, alkyl, alkoxyalkyl, siloxyalkyl, and perfluoroalkyl; and D is a divalent linkage. In specific embodiments, D is arylene, substituted arylene, heteroarylene, or substituted heteroarylene. In more specific embodiments, D is phenylene, thienothiophene, benzothiophene, carbazole, indolocarbazole, fluorene, benzodithiophene. In other specific embodiments, R and R' are selected from alkyl. In more specific embodiments, R and R' are alkyl from about 1 to about 25, including from about 4 to about 18 carbon atoms (included throughout are numbers within the range, for example 4, 5, 6, 7, 8, 9, 10, 11, 12, 13, 14, 15, 16, 17 and 18), and further including from about 6 to about 16 carbon atoms, such as butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl, isomeric forms thereof, mixtures thereof, and the like. Examples of D include phenylene, biphenylene, phenanthrenylene, dihydrophenanthrenylene, fluorenylene, oligoarylene, and dioxyarylene. In further specific embodiments of Formula A or B, x, y, and z are independently integers from 1 to 7; m is an integer from 1 to 3; n is an integer from 1 to 3; w is from 0 to 5; R and R' are independently selected from hydrogen, halogen, alkyl, alkoxyalkyl, siloxyalkyl, and perfluoroalkyl; and D is a divalent linkage.

In specific embodiments, the semiconductor is an inorganic semiconductor and the SMCNTs are modified with an inorganic material. More specifically, the inorganic semiconductor is in nanoparticle and/or nanorod form, and the SMCNTs are modified with inorganic nanoparticles.

The carbon nanotubes themselves may be single-wall carbon nanotubes, double-wall carbon nanotubes, or multi-wall carbon nanotubes. A single-wall carbon nanotube is a cylinder formed by joining together the edges of a rectangular graphene sheet. A multi-wall carbon nanotube is composed of a number of cylindrical carbon nanotubes having different diameters, which are formed concentrically around each other. The carbon nanotubes can have any suitable length and diameter. The surface modifying group can be attached on the wall or at the ends of the carbon nanotubes.

Modifying the surface of the carbon nanotubes enables better miscibility between the carbon nanotubes and the semiconductor. Typically, nanoparticles prefer to form aggregates, due to strong van der Waals force, so that nano-scale dispersion is difficult to achieve. The surface modification increases solubility and allows real nano-scale dispersion of the carbon nanotubes in the semiconductor. When the surface is modified with a conjugated moiety, better charge transfer occurs between the carbon nanotubes and the semiconductor.

The surface-modified carbon nanotubes are present in the amount of from about 0.001 to about 10 weight percent, based on the weight of the semiconductor. In some embodiments, they are present in the amount of from about 0.01 to about 5 weight percent or from about 0.01 to about 1 weight percent. In embodiments where the semiconducting layer comprises a first layer and a second layer (as in FIG. 5), the SMCNTs may be present in the amount of from about 0.001 to about 10 volume percent, based on the total volume of the semiconducting layer. In other embodiments, the SMCNTs may be present in the amount of more than 10 volume percent, from more than 10 volume percent to about 50 volume percent, or from more than 10 volume percent to about 20 volume percent, based on the total volume of the semiconducting layer.

Carbon nanotubes can be surface modified by suitable methods. For example, a reactive site can be created on the carbon nanotubes, then a polymer, oligomer, or small molecular compound can be grafted onto the nanotubes at that reactive site. Another approach involves the introduction of carboxylic acid groups onto a carbon nanotube surface via an acid treatment. For example, a mixture of sulfuric acid and nitric acid can be used to form carboxylic acid groups on the surface of a carbon nanotube. Other surface modifying groups can then react with the carboxylic acid group. Other approaches include plasma treatment or direct reaction with highly reactive chemicals such as dichlorocarbene.

In some embodiments, the semiconducting layer further comprises non-surface-modified carbon nanotubes (non-SM-CNTs). The non-SMCNTs may be present in the amount of from about 0.001 to about 10 weight percent, or from about 0.01 to about 5 weight percent, based on the weight of the semiconductor.

In other embodiments, both SMCNTs and non-SMCNTs are present in the semiconducting layer. The SMCNTs are present in the amount of from about 0.001 to about 5 weight percent and the non-SMCNTs are present in the amount of from about 0.001 to about 10 weight percent, both based on the weight of the semiconductor.

The carbon nanotubes may be dispersed in the semiconductor of the semiconducting layer. They may be dispersed homogeneously or in small aggregates. In some alternative embodiments, the semiconducting layer comprises a first layer and a second layer; a majority of the SMCNTs are located in the first layer and a majority of the semiconductor is located in the second layer. The term "majority" refers to more than 50 weight percent based on the total weight of the relevant layer. However, the concentration (of SMCNT in the first layer or semiconductor in the second layer) is preferably more than 80 weight percent or more than 90 weight percent. A dual-layer structure can be formed by depositing a SMCNT dispersion to form the first layer and a semiconductor solution or dispersion to form the second layer separately. A dual-layer structure can also be formed by depositing a mixture of SMCNTs and semiconductor in a proper liquid vehicle, followed by thermal annealing to induce phase separation into dual-layer structure. One advantage to this dual-layer structure is that the SMCNTs adhere well to the substrate and/or dielectric layer, which prevents delamination during bending and/or flexing of the OTFT. When the dual-layer structure is present, the source and drain electrodes can contact either the first or second layers.

The presence of surface-modified carbon nanotubes in the semiconducting layer improves the mobility of the TFT. The SMCNTs are generally more conductive than the semiconductor. It is believed that the SMCNTs may form non-percolating arrays inside the channel. The effective channel length may thus be reduced, dramatically improving the mobility. It is also believed that the SMCNTs electrically connect adjacent crystal domains of the semiconductor. These connections overcome the grain boundary effect, which typically decreases mobility. In embodiments, the mobility is improved by at least 10%, including at least 50% or by at least a factor of 2, over a transistor containing no SMCNTs in the semiconducting layer.

The semiconducting layer is from about 5 nanometers to about 1000 nanometers deep, including from about 20 to about 100 nanometers in depth. In certain configurations, such as the configurations shown in FIGS. 1 and 4, the semiconducting layer completely covers the source and drain electrodes.

The semiconducting layer can be formed by molecular beam deposition, vacuum evaporation, sublimation, spin-on coating, dip coating, printing (e.g., inkjet printing, screen printing, stencil printing, microcontact printing, flexographic printing), and other conventional processes known in the art.

In embodiments, the semiconducting layer is formed by a liquid deposition process such as spin-on coating, dip coating, or printing (e.g., inkjet printing, screen printing, stencil printing, microcontact printing, flexographic printing). Any suitable solvent can be used as a vehicle to carry the semiconductor and SMCNTs. Exemplary solvents include water, alcohol, acetate, aromatic hydrocarbons such as toluene, xylene, and mesitylene, linear hydrocarbons such as hexane and cyclohexane, chlorinated solvents such as chlorobenezene, dichlorobenzene, trichlorobenzene, and chlorotoluene, and ketones such as acetone and methyl ethyl ketone. The semiconductor (organic or inorganic) can be dissolved or dispersed in the solvent at a concentration from about 0.1 to about 20 weight percent, preferably from about 0.2 to about 10 weight percent. The SMCNTs are dispersed in the solvent at a concentration from about 0.001 to about 10 weight percent, preferably from about 0.01 to about 5 weight percent. The semiconductor and the SMCNTs can be in the same solvent or different solvent.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 1 to about 10 millimeters for a rigid substrate such as glass or silicon.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical materials suitable for use as source and drain electrodes include those of the gate electrode materials such as aluminum, zinc, indium, conductive metal oxides such as zinc-gallium oxide, indium tin oxide, indium-antimony oxide, conducting polymers and conducting inks. Typical thicknesses of source and drain electrodes are, for example, from about 40 nanometers to about 1 micrometer, including more specific thicknesses of from about 100 to about 400 nanometers.

The gate dielectric layer generally can be an inorganic material film or an organic polymer film. Examples of inorganic materials suitable as the gate dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, poly(methacrylate)s, poly(acrylate)s, epoxy resin and the like. The thickness of the gate dielectric layer depends on the dielectric constant of the material used and can be, for example, from about 5 nanometers to about 5000 nanometers, including from about 100 to about 1000 nanometers. The gate dielectric layer may have a conductivity that is, for example, less than about $10^{-12}$ Siemens per centimeter (S/cm). The gate dielectric layer is formed using conventional processes known in the art, including those processes described in forming the gate electrode.

The various components of the OTFT may be deposited upon the substrate in any order. Generally, however, the gate electrode and the semiconducting layer should both be in contact with the gate dielectric layer. In addition, the source and drain electrodes should both be in contact with the semiconducting layer.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

Example 1

Single wall carbon nanotubes are purchased from Carbon Solutions, Inc. (USA) and are known to be highly COOH functionalized or modified (~4 to 6 atomic % of COOH). A polythiophene of the following formula is used as the organic semiconductor:

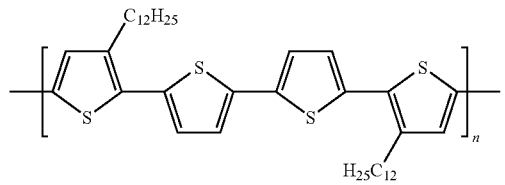

where n is a number of from about 5 to about 5,000. This polythiophene and its preparation are described in U.S. Pat. No. 6,770,904, the disclosure of which is totally incorporated herein by reference. 1 milligram of SMCNTs and 12 mg of polythiophene are added into 4 g dichlorobenzene solvent. The mixture is heated to about 120° C. to dissolve the polythiophene, followed by ultrasonication at room temperature for about 30 min to form a stable dispersion. The dispersion is optionally filtered with a 1 micron glass filter.

A bottom-contact thin film transistor structure, as schematically described by FIG. 3, is chosen as the primary test device configuration. The test device is comprised of an n-doped silicon wafer with a thermally grown silicon oxide layer of a thickness of about 200 nanometers thereon. The wafer functions as the gate electrode while the silicon oxide layer acts as the insulating layer and has a capacitance of about 15 nF/cm². The silicon wafer is first cleaned with argon plasma, isopropanol, air dried, and then immersed in a 0.1 M solution of octyltrichlorosilane in toluene for about 20 minutes at room temperature. Subsequently, the wafer is washed with toluene, isopropanol and air-dried. Gold particles are vacuum evaporated on top of the modified silicon wafer through a shadow mask to form the source and drain electrodes. The above dispersion is spin coated on the modified silicon wafer at 1000 rpm for 120 seconds, resulting in a homogenous semiconductor polythiophene layer of about 30 nanometers in thickness. The transistors are dried and annealed in vacuo at 80-140° C. before characterization.

The TFT performance is evaluated using a Keithley 4200 SCS semiconductor characterization system. The field-effect mobility in the saturated regime, µ, is calculated according to equation (1)

$$I_{SD}=C_i\mu(W/2L)(V_G-V_T)^2 \qquad (1)$$

where $I_{SD}$=drain current at the saturated regime, W and L are respectively channel width and length, $C_i$ is the capacitance per unit area of the gate dielectric layer, and $V_G$ and $V_T$ are respectively gate voltage and threshold voltage. Transistors with different channel length and channel width are characterized. The transistors with SMCNTs show mobility at least 10% higher than those with the polythiophene semiconductor only as the semiconducting layer.

Example 2

A 0.2 M solution of zinc acetate in a mixture of ethanolamine and methoxyethanol (with Zn/amine=1 molar ratio) is first prepared by adding methoxyethanol to a mixture of zinc acetate dihydrate (1.10 g, 5 mmol) and ethanolamine (0.32 g, 5 mmol), followed by heating at 60° C. for 1 hr to dissolve the solid. 10 mg of the SMCNTs from Example 1 are added to this solution and ultrasonicated at room temperature for 30 min. The solution is optionally filtered with a 1 micron glass filter.

A TFT device having the configuration of FIG. 2 is prepared as follows. A glass substrate coated with an indium-tin oxide (ITO) layer, which functions as the gate electrode, and an aluminum-tin oxide (ATO, 100 nm) top layer (the gate dielectric) is first cleaned with oxygen plasma and then spin-coated with above SMCNTs and zinc acetate mixture at a speed of 1000 rpm for 1 minute, and then heated on a hot plate at 180° C. for 30 min. It is then placed in a pre-heated oven at 400° C. for 30 min. Finally, an array of aluminum source-drain electrode pairs with channel length of 90 microns and channel width of 5000 microns are vacuum-evaporated on top of the ZnO/SMCNTs layer to form TFTs.

The TFTs are characterized in the same manner as Example 1. The transistors with SMCNTs show mobility at least 10% higher than those with the zinc oxide semiconductor only in the semiconducting layer.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. An organic thin-film transistor comprising a substrate, a dielectric layer, and a semiconducting layer, wherein the semiconducting layer comprises an organic semiconductor and surface-modified carbon nanotubes (SMCNTs),
wherein the SMCNTs are modified with a non-conjugated group selected from the group consisting of polymers or oligomers of polystyrene, polyvinyl alcohol, polyacrylate, polyimide, polyamide, polysiloxane, alkoxy, alkoxyalkyl, cyano, and nitro.

2. The transistor of claim 1, wherein the SMCNTs are dispersed substantially throughout the organic semiconductor.

3. The transistor of claim 2, wherein the SMCNTs are present in the amount of from about 0.001 to about 10 weight percent, based on the weight of the organic semiconductor.

4. The transistor of claim 2, wherein the SMCNTs are present in the amount of from about 0.01 to about 5 weight percent, based on the weight of the organic semiconductor.

5. The transistor of claim 1, wherein the semiconducting layer comprises a first layer and a second layer; the SMCNTs are present in the first layer and the organic semiconductor is present in the second layer; and the first layer is located closer to the dielectric layer than the second layer.

6. The transistor of claim 1, wherein the SMCNTs are single-wall carbon nanotubes, double-wall carbon nanotubes, or multi-wall carbon nanotubes.

7. The transistor of claim 1, wherein the transistor has a charge carrier mobility of greater than 0.01 cm$^2$/V·sec.

8. The transistor of claim 1, wherein the transistor has a mobility that is at least 10% greater than a transistor without SMCNTs in the organic semiconducting layer.

9. An organic thin-film transistor comprising a substrate, a dielectric layer, and a semiconducting layer, wherein the semiconducting layer comprises an organic semiconductor and surface-modified carbon nanotubes (SMCNTs); wherein the semiconducting layer comprises a first layer and a second layer; the SMCNTs are present in the first layer and the organic semiconductor is present in the second layer and the first layer is located closer to the dielectric layer than the second layer; and wherein wherein the SMCNTs are present in greater than 10% by volume of the total volume of the semiconducting layer.

10. An organic thin-film transistor comprising a substrate, a dielectric layer, and a semiconducting layer, wherein the semiconducting layer comprises an organic semiconductor and surface-modified carbon nanotubes (SMCNTs): and wherein the semiconducting layer further comprises non-surface-modified carbon nanotubes (non-SMCNTs).

11. The transistor of claim 10, wherein the non-SMCNTs are present in the amount of from about 0.001 to about 10 weight percent, based on the weight of the organic semiconductor.

12. The transistor of claim 10, wherein the non-SMCNTs are present in the amount of from about 0.01 to about 5 weight percent, based on the weight of the organic semiconductor.

13. A semiconducting layer comprising an organic semiconductor and SMCNTs, wherein the SMCNTs are modified with a thiophene-based oligomer or polymer of Formula A or B:

Formula A

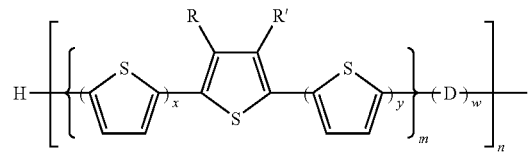

Formula B

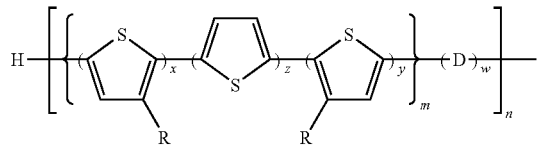

wherein x, y, and z are independently integers from 0 to 7; m is an integer from 1 to 3; n is an integer from 1 to 50; w is an integer from 0 to 5; R and R' are independently selected from hydrogen, halogen, alkyl, alkoxyalkyl, siloxyalkyl, and perfluoroalkyl; and D is a divalent linkage.

14. A thin-film transistor comprising a substrate, a dielectric layer, and a semiconducting layer, wherein the semiconducting layer comprises an inorganic semiconductor and surface-modified carbon nanotubes (SMCNTs).

15. An organic thin-film transistor comprising a substrate, a dielectric layer, and a semiconducting layer, wherein the semiconducting layer comprises an organic semiconductor and surface-modified carbon nanotubes (SMCNTs), wherein the SMCNTs are modified with inorganic nanoparticles selected from the group consisting of gold, silver, nickel, copper, ZnO, CdSe, $Zn_aIn_bO_c$ (where a, b, and c are integers), GaAs, ZnO—$SnO_2$, $SnO_2$, and ZnSe nanoparticles.

* * * * *